United States Patent
Fang et al.

(10) Patent No.: US 8,441,063 B2
(45) Date of Patent: May 14, 2013

(54) MEMORY WITH EXTENDED CHARGE TRAPPING LAYER

(75) Inventors: Shenqing Fang, Fremont, CA (US);
Tung-Sheng Chen, Cupertino, CA (US);
Chun Chen, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 4 days.

(21) Appl. No.: 12/982,006

(22) Filed: Dec. 30, 2010

(65) Prior Publication Data
US 2012/0168847 A1   Jul. 5, 2012

(51) Int. Cl.
*H01L 29/792* (2006.01)
*H01L 21/336* (2006.01)

(52) U.S. Cl.
USPC ............ 257/324; 257/E29.309; 257/E21.423; 257/E21.21; 257/E21.679; 438/287; 438/954

(58) Field of Classification Search ........................ None
See application file for complete search history.

(56) References Cited

U.S. PATENT DOCUMENTS

| | | | |
|---|---|---|---|
| 4,264,376 A * | 4/1981 | Yatsuda et al. | 438/287 |
| 5,349,221 A * | 9/1994 | Shimoji | 257/324 |
| 5,838,041 A * | 11/1998 | Sakagami et al. | 257/324 |
| 6,365,944 B1 * | 4/2002 | Reisinger | 257/390 |
| 6,399,466 B2 * | 6/2002 | Nakamura | 438/591 |
| 6,458,661 B1 * | 10/2002 | Sung | 438/275 |
| 6,590,253 B2 * | 7/2003 | Chen | 257/314 |
| 6,686,242 B2 * | 2/2004 | Willer et al. | 438/257 |
| 6,818,944 B2 * | 11/2004 | Lee | 257/324 |
| 6,894,340 B2 * | 5/2005 | Kuo et al. | 257/315 |
| 6,940,120 B2 * | 9/2005 | Hashimoto et al. | 257/314 |
| 6,959,920 B2 * | 11/2005 | Roizin et al. | 257/324 |
| 6,991,986 B2 * | 1/2006 | Lee | 438/261 |
| 7,038,291 B2 * | 5/2006 | Goda et al. | 257/510 |
| 7,081,651 B2 * | 7/2006 | Choi et al. | 257/324 |
| 7,217,972 B2 * | 5/2007 | Mori | 257/315 |
| 7,495,284 B2 * | 2/2009 | Lee | 257/324 |
| 7,564,094 B2 * | 7/2009 | Kim et al. | 257/324 |
| 7,635,633 B2 * | 12/2009 | Oh et al. | 438/288 |
| 7,638,850 B2 * | 12/2009 | Lusky et al. | 257/390 |
| 7,648,881 B2 * | 1/2010 | Lee | 438/287 |
| 7,750,391 B2 * | 7/2010 | Ozawa | 257/314 |
| 7,786,512 B2 * | 8/2010 | Bloom et al. | 257/202 |
| 7,791,129 B2 * | 9/2010 | Terai | 257/323 |
| 7,804,126 B2 * | 9/2010 | Eitan et al. | 257/324 |
| 7,851,296 B2 * | 12/2010 | Noda et al. | 438/216 |
| 7,923,770 B2 * | 4/2011 | Chen et al. | 257/321 |
| 7,964,459 B2 * | 6/2011 | Lusky et al. | 438/201 |
| 8,247,857 B2 * | 8/2012 | Ozawa et al. | 257/314 |
| 8,278,696 B2 * | 10/2012 | Ozawa et al. | 257/314 |
| 8,344,446 B2 * | 1/2013 | Tsuji | 257/326 |
| 2002/0132430 A1 * | 9/2002 | Willer et al. | 438/262 |
| 2003/0001196 A1 * | 1/2003 | Choi et al. | 257/315 |
| 2003/0062567 A1 * | 4/2003 | Zheng et al. | 257/316 |
| 2003/0218207 A1 * | 11/2003 | Hashimoto et al. | 257/315 |

(Continued)

FOREIGN PATENT DOCUMENTS

| | | |
|---|---|---|
| KR | 100759845 | 9/2007 |
| KR | 1020080074406 | 8/2008 |

*Primary Examiner* — Hoang-Quan Ho

(57) ABSTRACT

A memory array includes a plurality of bit lines and a plurality of word lines, a gate region, and a charge trapping layer. The charge trapping layer is wider than a word line; the charge trapping layer is extended beyond the edge of the gate region to facilitate capturing and removing charges.

12 Claims, 4 Drawing Sheets

U.S. PATENT DOCUMENTS

| | | | |
|---|---|---|---|
| 2005/0037575 A1* | 2/2005 | Lee | 438/257 |
| 2006/0208281 A1* | 9/2006 | Shappir | 257/202 |
| 2007/0228447 A1* | 10/2007 | Ozawa | 257/314 |
| 2007/0284650 A1* | 12/2007 | Willer | 257/324 |
| 2008/0150008 A1* | 6/2008 | Kim et al. | 257/324 |
| 2008/0188049 A1* | 8/2008 | Shim et al. | 438/287 |
| 2008/0230831 A1* | 9/2008 | Noda et al. | 257/325 |
| 2009/0008701 A1* | 1/2009 | Kim et al. | 257/324 |
| 2009/0261405 A1* | 10/2009 | Kim et al. | 257/324 |
| 2009/0294828 A1* | 12/2009 | Ozawa et al. | 257/319 |
| 2010/0013002 A1* | 1/2010 | Tsuji | 257/326 |
| 2010/0109069 A1 | 5/2010 | Yaegashi | |
| 2010/0309729 A1* | 12/2010 | Chang et al. | 365/185.28 |

* cited by examiner

MEMORY WITH EXTENDED CHARGE TRAPPING LAYER

TECHNICAL FIELD

Embodiments in accordance with the present invention generally relate to semiconductor devices such as flash memories.

BACKGROUND

One type of non-volatile integrated circuit memory (e.g., flash memory) employs floating gate memory cells. Another type of flash memory cell uses charge trapping memory cells. In a charge trapping memory cell, a charge trapping region can be charged (programmed) and discharged (erased) to store a respective bit value.

An array of memory cells includes a number of word lines formed on a substrate. The word lines are separated from each other by a spacer made of a dielectric material. A problem with conventional charge trapping memory cells is that, when they are erased, charges will become trapped in the spacer material instead of moving to the substrate. As a result, source/drain regions in the substrate may become partially depleted, increasing resistance and consequently increasing the voltage drops across those regions and across the memory array.

A solution that addresses the issues discussed above would thus be beneficial.

SUMMARY

According to an embodiment of the present invention, a memory array includes a plurality of bit lines and a plurality of word lines, a gate region, and a charge trapping layer. The charge trapping layer is wider than a word line; the charge trapping layer is extended beyond the edge of the gate region to facilitate capturing and removing charges. As a result, depletion in source/drain regions is reduced, resistance is reduced, and hence the voltage drop along word lines and across the memory array is reduced.

These and other objects and advantages of the various embodiments of the present invention and their advantages will be recognized by those of ordinary skill in the art after reading the following detailed description of the embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

DETAILED DESCRIPTION

Reference will now be made in detail to embodiments of the invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, the present invention may be practiced without these specific details. In other instances, well-known methods, procedures, components, and circuits have not been described in detail as not to unnecessarily obscure aspects of the present invention.

Some portions of the detailed descriptions that follow are presented in terms of procedures, logic blocks, processes, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "coating," "depositing," "etching," "fabricating," "implanting," "cleaning," "growing," or the like, refer to actions and processes of semiconductor device fabrication.

It is understood that the figures are not drawn to scale, and only portions of the structures depicted, as well as the various layers that form those structures, are shown.

Figure 1:
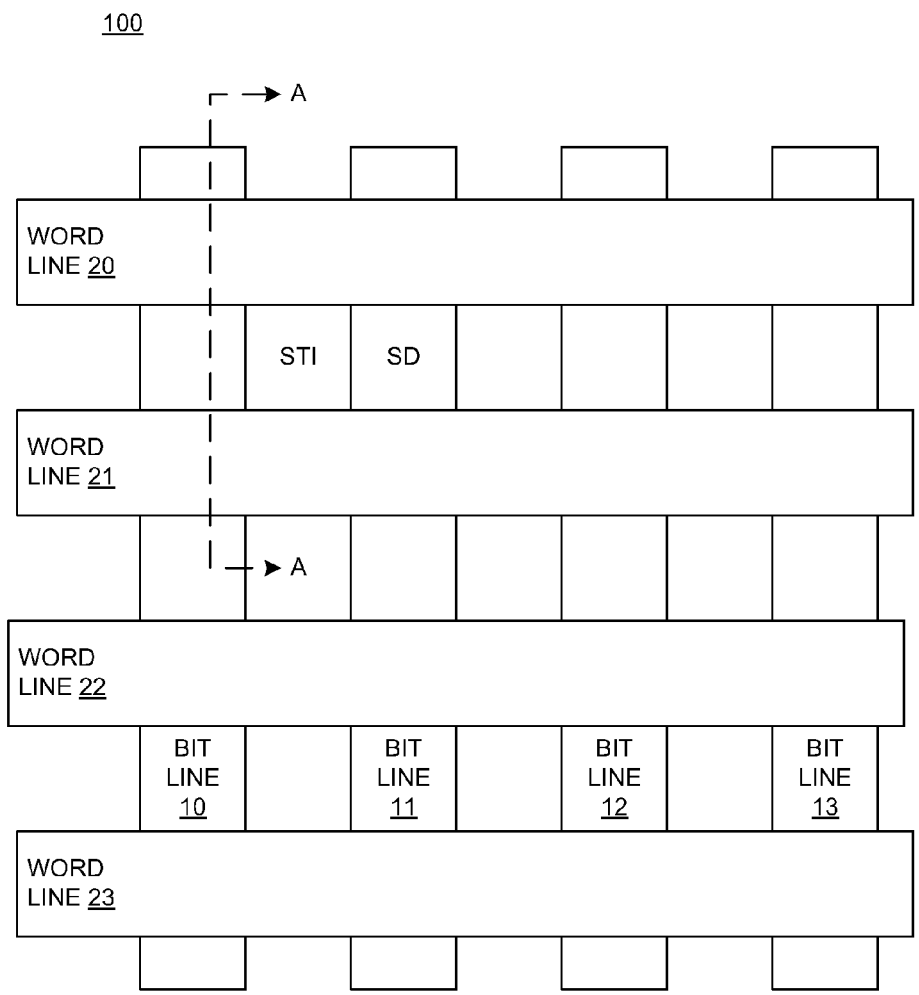
FIG. 1 illustrates a portion of a memory array according to an embodiment of the present invention.

FIG. 1 illustrates a portion of a memory array 100, showing a number of bit lines 10, 11, 12, and 13, and a number of word lines 20, 21, 22, and 23. The word lines cross but are not in contact with the bit lines. The bit lines are essentially parallel to each other, and the word lines are essentially parallel to each other and perpendicular to the bit lines. Memory cells lie at the crossing points of the bit lines and word lines. The memory array 100 may be used in a charge trapping memory device (e.g., a flash memory device). A charge trapping device may also be referred to as a charge trapping NAND device or NAND flash.

Shallow trench isolation (STI) regions isolate the bit lines from one another. A source/drain (SD) region is situated along (beneath) each bit line and between each pair of adjacent word lines.

Figure 2:
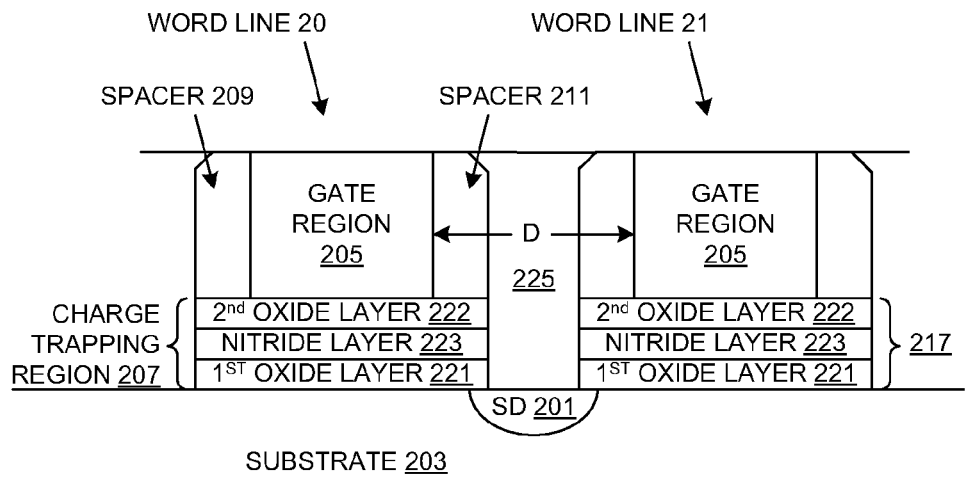
FIG. 2 represents a cross-sectional view of a portion of a memory array with extended charge trapping regions according to an embodiment of the present invention.

FIG. 2 represents a cross-sectional view of a portion of the memory array 100, taken along axis A-A in FIG. 1. A cross-sectional view of two word lines (e.g., word lines 20 and 21) is shown. Not all layers and structures are necessarily shown in FIG. 2.

In the example of FIG. 2, a source/drain (SD) region 201 is formed in the substrate 203. The substrate 203 may be a silicon substrate, and the SD region 201 may be doped with n-type dopant.

Using word line 20 as an example, each word line includes a gate region 205 formed adjacent to a charge trapping region 207. In one embodiment, the gate region 205 is formed using polysilicon. A spacer 209 is on one side of the gate region 205, and a spacer 211 is on the other side of the gate region. The spacers 209 and 211 can be formed using a dielectric material.

In the embodiment of FIG. 2, the charge trapping region 207 includes a first oxide layer 221, a second oxide layer 222, and a nitride layer 223 that is sandwiched between the first and second oxide layers. The nitride layer 223 may also be referred to as a charge trapping layer. The charge trapping region 207 may also be referred to as an ONO (oxide-nitride-oxide) layer.

Significantly, the nitride layer 223 extends beyond the outer edges of the gate region 205. Generally speaking, the charge trapping region 207, including the oxide layers 221 and 222 and the nitride layer 223, extends beyond the outer edges of the gate region 205. In one embodiment, the charge trapping region 207 extends to the outer edges of the spacers 209 and 211. From another perspective, the word lines 20 and 21 are separated by a distance D, but the charge trapping region 207 and the charge trapping region 217 (for word line 21) are separated by a distance less than D.

Additional dielectric material 225 is deposited between the spacers 209 and 211, essentially filling the gap between the word lines 20 and 21.

Figure 3:
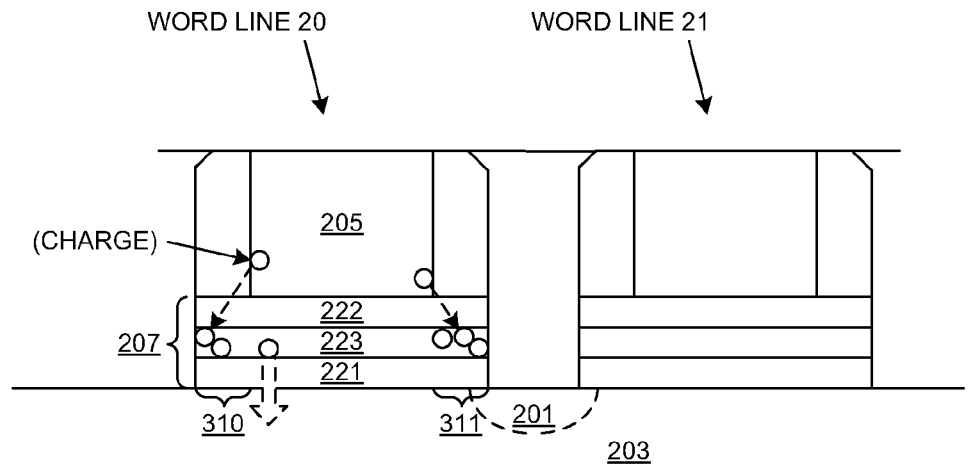
FIG. 3 also is a cross-sectional view but shows the movement of charges within a memory array with extended charge trapping regions according to an embodiment of the present invention.

FIG. 3 also is a cross-sectional view of the word lines 20 and 21 but shows the movement of charges (electrons) within the illustrated portion of a memory array. Electrons are collected by the charge trapping region 207 and removed by FN (Fowler-Nordheim) tunneling during erase.

Importantly, because the charge trapping region 207 extends beyond the edges of the gate region 205, electrons that travel through the edges of the gate region 205 can be captured in the charge trapping region instead of in a spacer. In a conventional device, the regions labeled 310 and 311 would be part of the spacers 209 and 211; that is, in a conventional device, spacer material would occupy the regions 310 and 311. However, according to embodiments of the invention, the regions 310 and 311 are occupied by the extended charge trapping (ONO) region 207.

Thus, compared to conventional devices, more charges are trapped within the charge trapping region 207. As illustrated in FIG. 3, electrons that conventionally would be trapped in spacer material are instead captured by the extended length of the charge trapping region 207. As a consequence, more trapped charges are advantageously conducted to the channel and erased instead of remaining trapped in the spacer material. Thus, depletion in the SD region 201 is reduced, contact resistance is reduced, and therefore the drive-current drop across the SD region is reduced. The contact resistance can accumulate from one cell to the next along a bit line and can cause sensing errors with insufficient drive current during read operations. Therefore, by reducing the charge trap-up in the charge trapping region across each memory cell, the total contact resistance along bit lines is also reduced. Reducing the contact resistance ensures normal sensing current during memory read-out operations.

Extending the charge trapping region 207 as just described provides additional benefits as the size of memory devices is reduced. For example, by extending the charge trapping region, the n+ junctions (e.g., SD region 201) remain separated in smaller devices.

Figure 4:
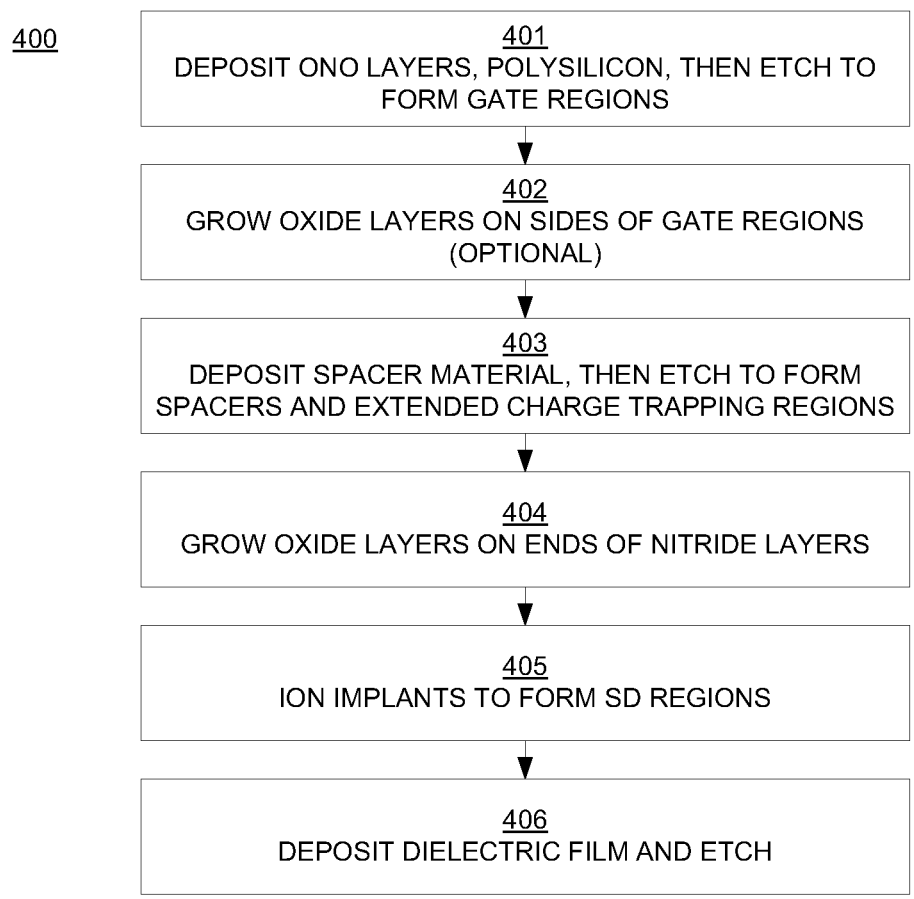
FIG. 4 is a flowchart showing selected steps for fabricating a memory array with extended charge trapping regions according to an embodiment of the present invention.

FIG. 4 is a flowchart 400 showing selected steps for fabricating a memory array with extended charge trapping regions according to an embodiment of the present invention. Other fabrication processes and steps may be performed along with the processes and steps discussed herein; that is, there may be a number of processes and steps before, in between, and/or after the steps shown and described herein. Importantly, embodiments of the present invention can be implemented in conjunction with these other processes and steps without significantly perturbing them. Generally speaking, the various embodiments of the present invention can replace portions of a conventional process without significantly affecting peripheral processes and steps.

Figure 5:
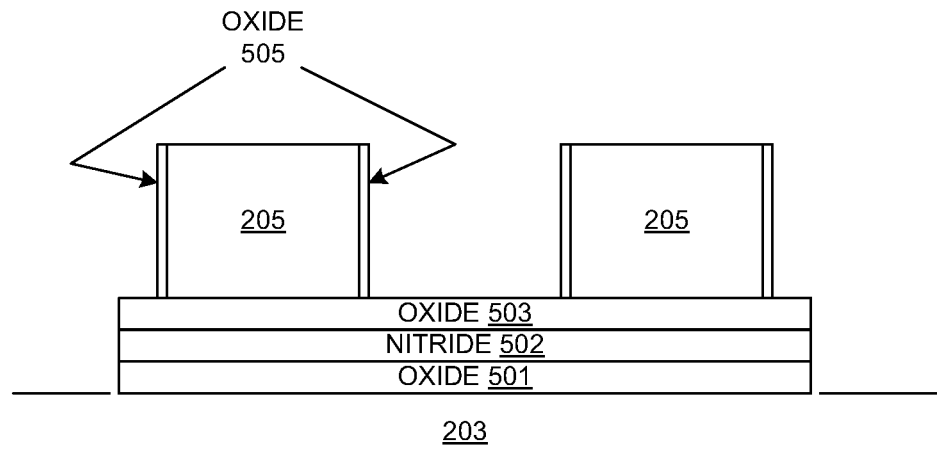
FIGS. 5 and 6 are cross-sectional views showing portions of a memory array at various stages of the fabrication process according to embodiments of the present invention.

In block 401, with reference also to FIG. 5, a first oxide layer 501, a nitride layer 502, and a second oxide layer 503 are deposited on a substrate 203. Polysilicon is then deposited, and then portions of the polysilicon are selectively etched away (e.g., using appropriately placed masks) to form the gate regions (e.g., the gate region 205). A dry etch that stops at the second oxide layer 503 may be used.

In block 402, in one embodiment, oxide layers 505 are grown on the sides of the gate regions.

Figure 6:
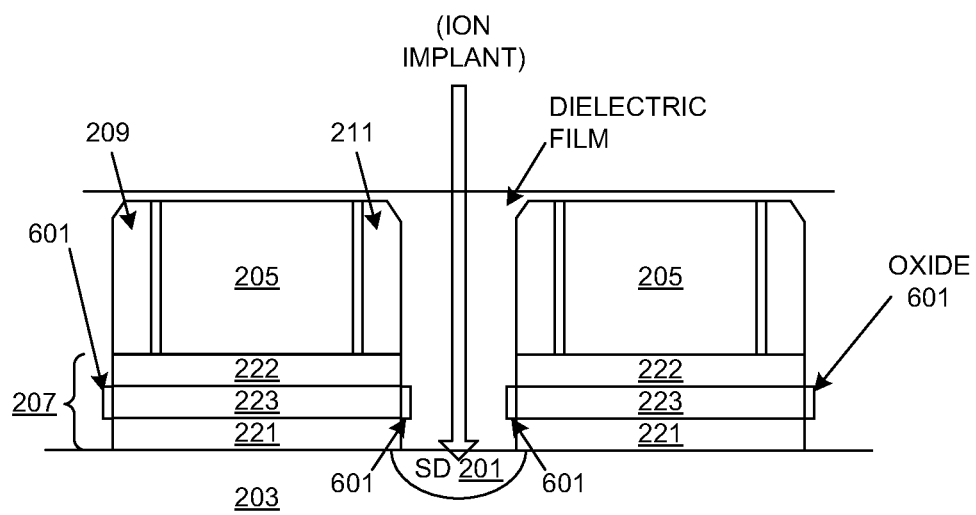

In block 403, spacer material is deposited. With reference also to FIG. 6, the spacer material, the second oxide layer, the nitride layer, and the first oxide layer are selectively etch away (e.g., using a dry etch) to form spacers (e.g., the spacers 209 and 211) and the extended charge trapping regions (e.g., the charge trapping region 207).

In block 404, in one embodiment, oxide layers 601 are grown on the ends of the charge trapping regions. Specifically, oxide layers are grown on the ends of the charge trapping (nitride) layers 223.

In block 405, an ion implant (e.g., an n+ dopant) is deposited into the gaps between adjacent spacers to form junctions (e.g., the SD region 201).

In block 406, a dielectric film is deposited to fill the gap between the spacers of adjacent word lines. (In the example of FIG. 6, the ion implant is performed before the dielectric film is deposited.) The deposited film can be etched back to form the structure shown in FIG. 2.

As mentioned, other processes can be performed before, in addition to, and after the various steps just described.

In summary, embodiments according to the present invention advantageously introduce an extended charge trapping region that facilitates programming and erasing in memory devices such as flash memory devices.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A memory array comprising:
   a plurality of bit lines; and
   a plurality of word lines including a first word line and a second word line, wherein said first word line comprises a first gate region adjacent to a first charge trapping layer and adjacent to a first spacer, wherein said second word line comprises a second gate region adjacent to a second charge trapping layer and adjacent to a second spacer, each of said first and second charge trapping layers comprising a nitride layer and each of said first and second charge trapping layers between a first oxide layer and a second oxide layer, wherein said first charge trapping layer is wider than said first word line and said second charge trapping layer is wider than said second word line, wherein further the region between said first and second spacers and said first and second charge trapping layers is filled with dielectric material, said memory array further comprising an oxide region formed on each end of the nitride layers of said first and second charge trapping layers, wherein said oxide region does not extend beyond the edges of said nitride layers to said first oxide layer and to said second oxide layer, wherein said dielectric material that fills said region between said first and second spacers is in contact with said first and second oxide layers but not said nitride layers.

2. The memory array of claim 1 wherein each of said first and second gate regions comprises polysilicon.

3. The memory array of claim 1 further comprising a substrate having formed therein a source/drain region, wherein said source/drain region is located between said first and second charge trapping layers.

4. A memory device comprising:
a plurality of bit lines; and
a plurality of word lines comprising a first word line and a second word line, wherein said first word line comprises a first polysilicon region adjacent to a first charge trapping region adjacent to a first spacer, and wherein said second word line comprises a second polysilicon region adjacent to a second charge trapping region and adjacent to a second spacer, said first charge trapping region and said second charge trapping region each comprising a nitride layer and each further comprising a first oxide layer and a second oxide layer, wherein said first and second polysilicon regions are separated by a greater distance than that separating said first and second charge trapping regions, wherein further the region between said first and second spacers and said first and second charge trapping regions is filled with dielectric material, the memory device further comprising an oxide region formed on each end of the nitride layers of said first and second charge trapping regions, wherein said oxide region does not extend beyond the edges of said nitride layers to said first oxide layer and beyond the edges of said nitride layers to said second oxide layer, wherein said dielectric material that fills said region between said first and second spacers is in contact with said first and second oxide layers but is not in contact with said nitride layers.

5. The memory device of claim 4 further comprising a substrate having formed therein a source/drain region, wherein said source/drain region is located between said first and second charge trapping regions.

6. A memory device comprising:
a substrate;
a first gate region and an adjacent first spacer;
a second gate region and an adjacent second spacer;
a first charge trapping region between said substrate and said first gate region, wherein said first charge trapping region extends beyond an edge of said first gate region;
a second charge trapping region between said substrate and said second gate region, wherein said second charge trapping region extends beyond an edge of said second gate region, wherein further the region between said first and second spacers and said first and second charge trapping regions is filled with dielectric material, each of said first and second charge trapping regions comprising a nitride layer, each of said first and second charge trapping regions further comprising a first oxide layer and a second oxide layer, wherein said nitride layer is between said first and second oxide layers; and
oxide regions formed on each end of the nitride layers of said first and second charge trapping regions, wherein said oxide regions do not overlap said first oxide layer and do not overlap said second oxide layer, wherein said dielectric material that fills said region between said first and second spacers is in contact with said first and second oxide layers but is not in contact with said nitride layers.

7. The memory device of claim 6 wherein each of said first and second gate regions comprises polysilicon.

8. The memory device of claim 6 wherein said substrate comprises a source/drain region, wherein said source/drain region is adjacent said first and second charge trapping regions.

9. The memory device of claim 6 further comprising an additional oxide region between said first gate region and said first spacer.

10. The memory array of claim 1 wherein the edge of said first spacer away from said first gate region and the outer edge of said first charge trapping layer are aligned.

11. The memory device of claim 4 wherein the outer edge of said first charge trapping layer and the outer edge of said first spacer are aligned.

12. The memory device of claim 6 wherein the outer edge of said first charge trapping layer does not extend beyond the edge of said first spacer that is not adjacent to said first gate region.

* * * * *